US011742341B2

(12) United States Patent  
Min

(10) Patent No.: US 11,742,341 B2  
(45) Date of Patent: Aug. 29, 2023

(54) METHOD OF MANUFACTURING A DISPLAY DEVICE USING A LASER AND DISPLAY PANEL PERFORATION

(71) Applicant: SAMSUNG DISPLAY CO., LTD., Yongin-si (KR)

(72) Inventor: Myungan Min, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 400 days.

(21) Appl. No.: 16/847,763

(22) Filed: Apr. 14, 2020

(65) Prior Publication Data

US 2020/0373288 A1 Nov. 26, 2020

(30) Foreign Application Priority Data

May 24, 2019 (KR) ........................ 10-2019-0061380

(51) Int. Cl.
| | | |
|---|---|---|
| *H01L 21/00* | (2006.01) | |
| *H01L 25/00* | (2006.01) | |
| *H01L 25/18* | (2023.01) | |
| *H05K 5/03* | (2006.01) | |
| *G02B 5/00* | (2006.01) | |
| *H05K 5/00* | (2006.01) | |
| *G02B 5/30* | (2006.01) | |

(52) U.S. Cl.
CPC ............. *H01L 25/50* (2013.01); *G02B 5/003* (2013.01); *G02B 5/3025* (2013.01); *H01L 25/18* (2013.01); *H05K 5/0017* (2013.01); *H05K 5/03* (2013.01)

(58) Field of Classification Search
CPC ......... H01L 25/50; H01L 25/18; H01L 51/56; H01L 27/3225; H01L 51/5262; H01L 2251/56; G02B 5/003; G02B 5/3025; H05K 5/0017; H05K 5/03; G02F 1/13338; G02F 1/133331; G09F 9/00; B23K 26/361; G06F 3/0412; H04N 5/2257

See application file for complete search history.

(56) References Cited

U.S. PATENT DOCUMENTS

| | | | | |
|---|---|---|---|---|
| 6,155,757 | A | * 12/2000 | Neumann | ............ B23K 26/361 409/293 |
| 9,632,487 | B2 | 4/2017 | Kim et al. | |
| 2011/0037059 | A1* | 2/2011 | Gyoda | ................ H01L 27/3276 445/25 |
| 2013/0278514 | A1* | 10/2013 | Jeon | ....................... G06F 3/0412 345/173 |

(Continued)

FOREIGN PATENT DOCUMENTS

| | | |
|---|---|---|
| KR | 10-2017-0015632 | 2/2017 |
| KR | 10-1754075 | 7/2017 |

(Continued)

*Primary Examiner* — Ismail A Muse  
(74) *Attorney, Agent, or Firm* — F. Chau & Associates, LLC

(57) ABSTRACT

A display device manufacturing method is provided including a display module in which an active area and a non-active area surrounding the active area are defined. A first hole is perforated having a first diameter on the active area. A second hole is formed having a second diameter by irradiating a laser area at least partially surrounding the first hole with a laser. The second diameter is larger than the first diameter.

19 Claims, 17 Drawing Sheets

(56) References Cited

U.S. PATENT DOCUMENTS

| | | | |
|---|---|---|---|
| 2016/0011633 A1* | 1/2016 | Watanabe | G02F 1/1333 |
| | | | 345/184 |
| 2016/0093596 A1 | 3/2016 | Hong et al. | |
| 2017/0087803 A1 | 3/2017 | Lancaster-Larocque et al. | |
| 2017/0222104 A1* | 8/2017 | Shimada | H01L 33/56 |
| 2017/0287992 A1 | 10/2017 | Kwak et al. | |
| 2018/0183015 A1 | 6/2018 | Yun et al. | |
| 2020/0013987 A1* | 1/2020 | Lee | C09J 7/38 |
| 2020/0212159 A1* | 7/2020 | Lee | H01L 51/5237 |
| 2020/0212357 A1* | 7/2020 | Lim | H01L 51/5253 |
| 2020/0358024 A1* | 11/2020 | Choi | H01L 51/56 |
| 2020/0373288 A1* | 11/2020 | Min | H05K 5/0017 |
| 2021/0265600 A1* | 8/2021 | Lee | H01L 51/5284 |

FOREIGN PATENT DOCUMENTS

| | | |
|---|---|---|
| KR | 10-2017-0111827 | 10/2017 |
| KR | 10-2018-0076429 | 7/2018 |

\* cited by examiner

METHOD OF MANUFACTURING A DISPLAY DEVICE USING A LASER AND DISPLAY PANEL PERFORATION

CROSS-REFERENCE TO RELATED APPLICATION

This U.S. non-provisional patent application claims priority under 35 U.S.C. § 119 to Korean Patent Application No. 10-2019-0061380, filed on May 24, 2019 in the Korean Intellectual Property Office, the disclosure of which is incorporated by reference herein in its entirety.

TECHNICAL FIELD

The present disclosure relates to a method of manufacturing a display device, and more particularly, to a method of manufacturing a display device using a laser and display panel perforation.

DISCUSSION OF THE RELATED ART

A display device displays an image from the display panel to an observing user. The display device may include various electronic modules for driving components of the display device, such as the display panel.

The display panel may be divided into an active area in which the image is displayed and a non-active area in which a driving circuit for driving the active area or wiring is disposed. The active area is an area of the display device in which the image is made visible to the user. Portions of a display device may be irradiated by a laser during manufacture. However, heat generated by the laser may damage adjacent components and thus compromise the integrity of the display device.

SUMMARY

According to an exemplary embodiment of the present invention, a display device manufacturing method is provided including a display module in which an active area and a non-active area surrounding the active area are defined. A first hole is perforated having a first diameter on the active area. A second hole is formed having a second diameter by irradiating a laser area at least partially surrounding the first hole with a laser. The second diameter is larger than the first diameter.

According to an exemplary embodiment of the present invention, the second hole is formed adjacent to an edge of the active area.

According to an exemplary embodiment of the present invention, the laser area is spaced apart from the first hole by an intervening residual area.

According to an exemplary embodiment of the present invention, a diameter of the laser area is equal to the second diameter.

According to an exemplary embodiment of the present invention, an electronic module is aligned to correspond to the second hole.

According to an exemplary embodiment of the present invention, the electronic module includes a camera module and the second hole overlaps a lens of the camera module.

According to an exemplary embodiment of the present invention, the second hole has a circular shape.

According to an exemplary embodiment of the present invention, a window is disposed on the display module.

According to an exemplary embodiment of the present invention, the display module includes a display panel, an antireflective layer, and an adhesive layer.

According to an exemplary embodiment of the present invention, the antireflective layer includes a polarizing layer.

According to an exemplary embodiment of the present invention, a light shielding layer is disposed on at least a portion of the inside of the second hole.

According to an exemplary embodiment of the present invention, the display module further includes an input sensing sensor.

According to an exemplary embodiment of the present invention, a display device manufacturing method includes preparing a display module in which an active area and a non-active area surrounding the active area are defined. Press-perforation is performed on the active area to form a hole and a burr adjacent to the hole. The burr is irradiated with a laser and an electronic module is aligned to correspond to the hole.

According to an exemplary embodiment of the present invention, the hole is formed adjacent to an edge of the active area.

According to an exemplary embodiment of the present invention, the electronic module comprises a camera module. The hole overlaps a lens of the camera module.

According to an exemplary embodiment of the present invention, the hole has a circular shape.

According to an exemplary embodiment of the present invention, a window is disposed on the display module.

According to an exemplary embodiment of the present invention, the display module includes a display panel, an antireflective layer, and an adhesive layer.

According to an exemplary embodiment of the present invention, the antireflective layer includes a polarizing layer.

According to an exemplary embodiment of the present invention, a light shielding layer is disposed on at least a portion of the inside of the hole.

BRIEF DESCRIPTION OF THE FIGURES

The above and other features of the present invention will become more apparent by describing in detail exemplary embodiments thereof with reference to the attached drawings, in which.

DETAILED DESCRIPTION OF THE EMBODIMENTS

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

The terms "include," "comprise," "including," or "comprising," may specify a property, a region, a fixed number, a step, a process, an element and/or a component but they do not exclude other additional properties, regions, fixed numbers, steps, processes, elements and/or components.

Figure 1:
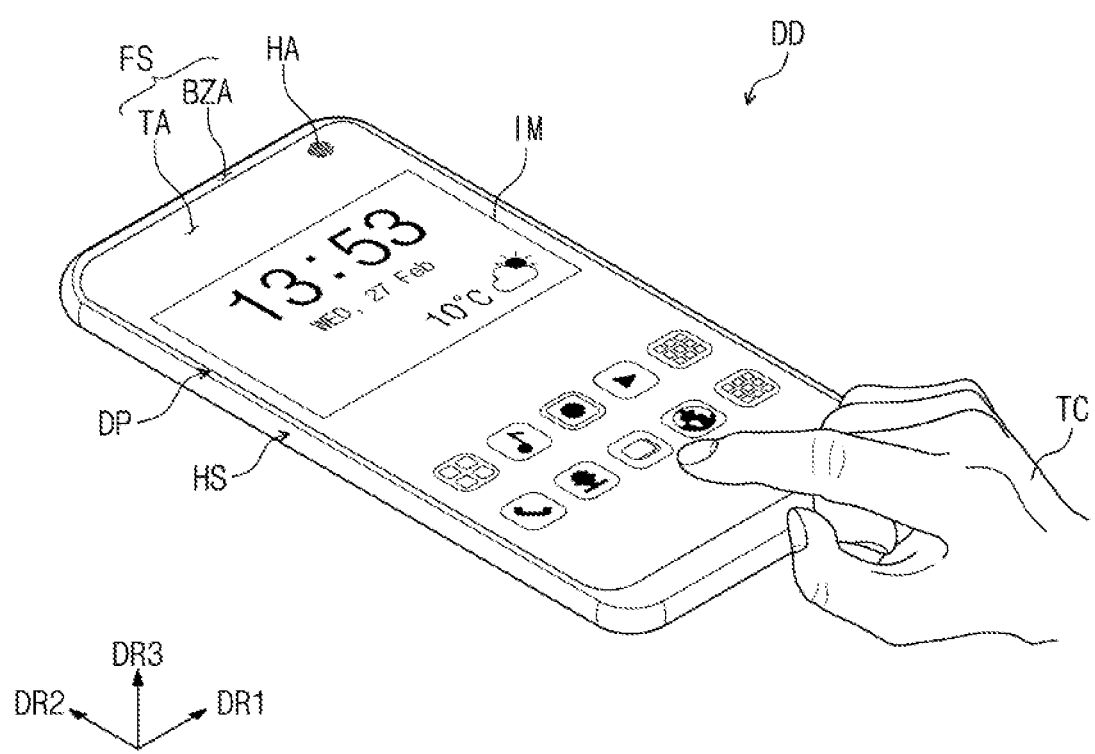
FIG. 1 is a perspective view illustrating a display device according to an exemplary embodiment of the present invention.
Figure 2:
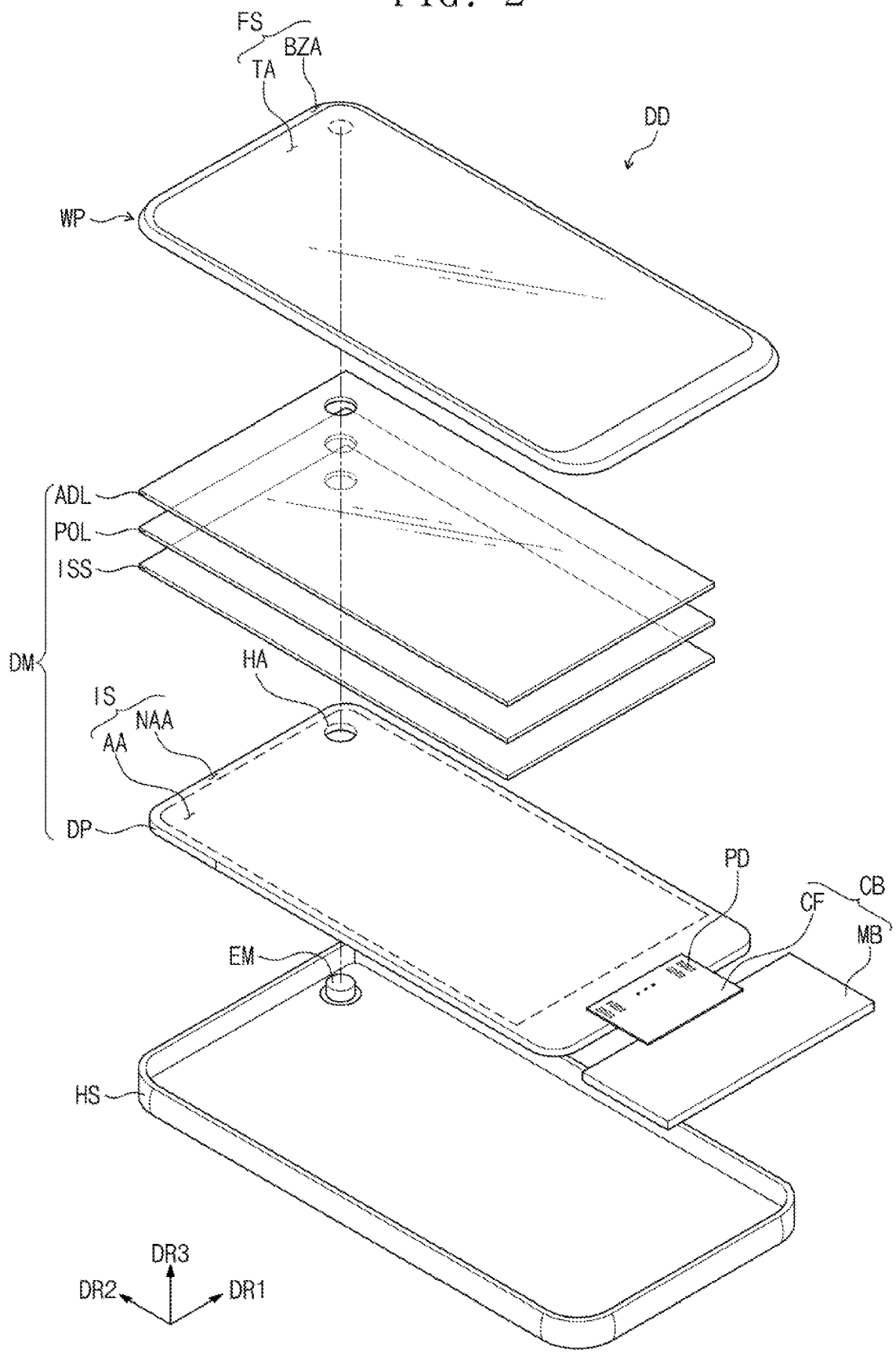
FIG. 2 is an exploded perspective view illustrating the display device shown in FIG. 1, according to an exemplary embodiment of the present invention.
Figure 3:
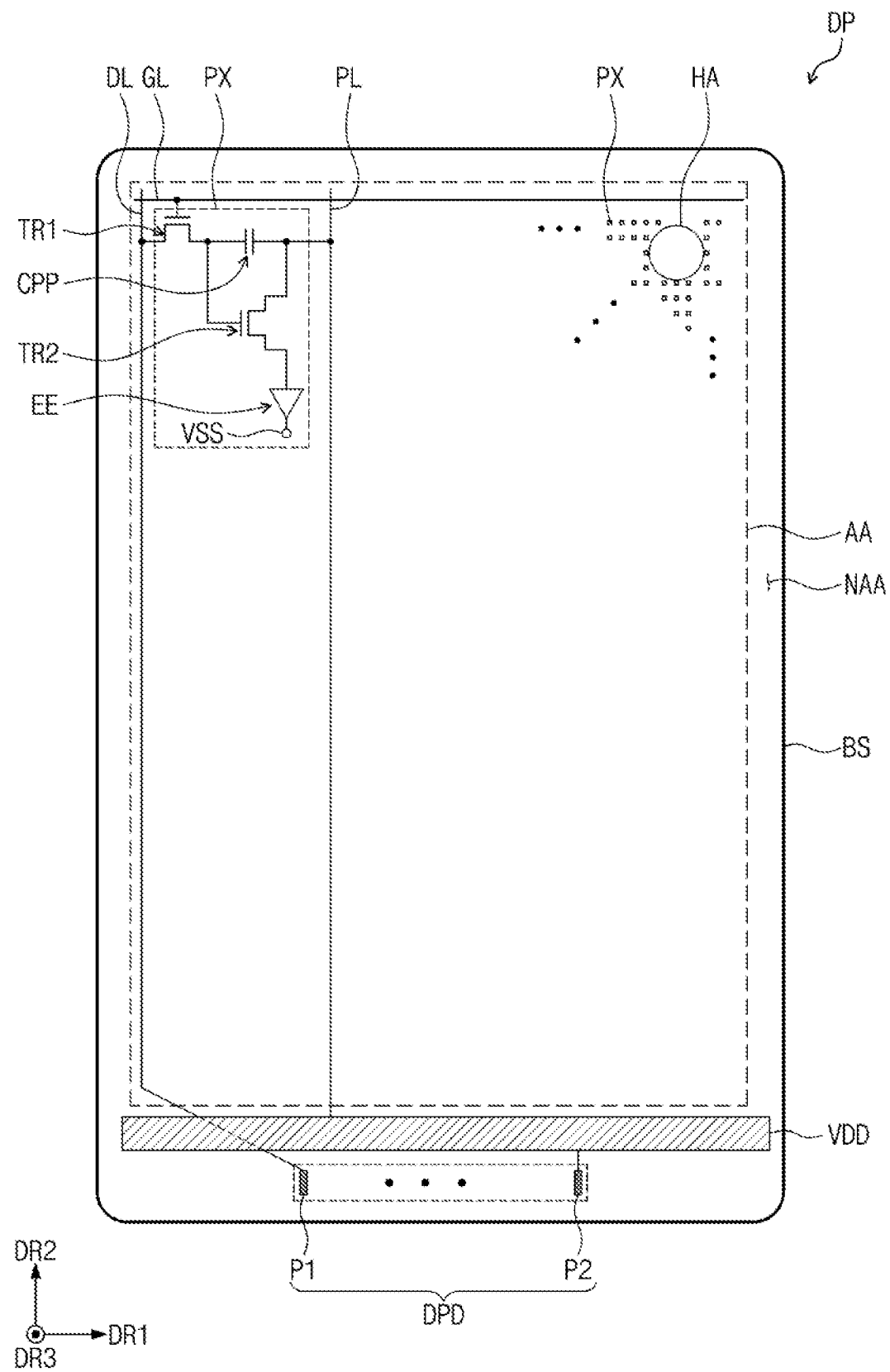
FIG. 3 is a plan view illustrating a display panel according to an exemplary embodiment of the present invention.

FIG. 1 is a perspective view illustrating a display device DD according to an exemplary embodiment of the present invention. FIG. 2 is an exploded perspective view illustrating the display device DD shown in FIG. 1. FIG. 3 is a plan view illustrating a display panel DP according to an exemplary embodiment of the present invention.

The display device DD may be a device that is activated in response to an electrical signal. The display device DD may include various embodiments. For example, the display device DD may include a tablet, a notebook, a computer, a smart television, and the like. In an exemplary embodiment of the present invention, the display device DD is illustratively shown as a smart phone. However, the display device DD is not limited thereto.

As shown in FIG. 1, the display device DD may display the image IM on the front surface FS. The front surface FS may be parallel to a plane defined by a first direction (e.g., a DR1 direction) and a second direction (e.g., a DR2 direction). The front surface FS includes a transmission area TA and a bezel area BZA adjacent to the transmission area TA.

The display device DD displays the image IM from the transmission area TA. The image IM may include at least one of a static image and a dynamic image. In FIG. 1, a clock and a plurality of icons are shown as an example of the image IM.

The transmission area TA may have a rectangular shape parallel to a plane defined by the first direction (e.g., the DR1 direction) and the second direction (e.g., the DR2 direction). However, this is illustrated by way of example, and the present transmission area TA is not limited thereto. For example, the transmission area TA may have various shapes and is not limited to any particular embodiment.

The bezel area BZA is adjacent to the transmission area TA. The bezel area BZA may surround the transmission area TA. However, this is illustratively shown, and the bezel area BZA may be disposed adjacent to only one to three sides of the transmission area TA, or may be omitted. A direction normal to the front surface FS (e.g., perpendicular to the front surface FS) may correspond to a thickness direction (e.g., a DR3 direction) hereinafter also referred to as a third direction of the display device DD. In an exemplary embodiment of the present invention, the front surface (e.g., an upper surface) and the rear surface (e.g., a lower surface) of each layer are defined with reference to the direction in which the image IM is displayed. For example, the front surface may refer to a surface comparatively closer to the display surface including the transmission area TA relative to an opposite, rear surface. The front surface and the rear surface are opposite to each other in the third direction (e.g., the DR3 direction).

The display device DD according to an exemplary embodiment of the present invention may detect an input TC of a user applied from the outside. The user's input TC includes various types of external inputs such as a part of the user's body, light, heat, or pressure. In addition, the display device DD may detect inputs that contact or are adjacent to the display device DD (e.g., hovering).

In this exemplary embodiment of the present invention, the user's input TC is shown with the user's hand applied to the front surface FS. However, this is illustrated by way of example, and as described above, the user's input TC may be provided in various forms. The display device DD may detect a user's input TC applied to the side surface or the rear surface of the display device DD according to the structure of the display device DD (e.g., a position of a touch sensing layer) and is not limited to any particular embodiment.

The display device DD may include a window WP, a display module DM, a circuit board CB, an electronic module EM, and a housing HS. The window WP and the housing HS are combined to define the appearance of the display device DD. For example, the housing HS may constitute outer sides of the display device DD other than the front surface FS on which the window WP is visible.

The window WP is disposed on the display panel DP to cover the front surface FS of the display panel DP. The window WP may include an optically transparent insulating material. For example, the window WP may include glass and/or plastic. The window WP may have a multi-layer or single-layer structure. For example, the window WP may have a laminated structure comprised of a plurality of plastic films bonded with an adhesive, or may have a laminated structure comprised of a glass substrate and/or a plastic film bonded with an adhesive.

The window WP includes a front surface FS exposed to the outside. The front surface FS of the display device DD may also be the front surface FS of the window.

For example, the transmission area TA may be an optically transparent area. The transmission area TA may have a shape corresponding to the active area AA. For example, the transmission area TA may be included in the front surface FS and may at least partially overlap the active area AA. The image IM displayed in the active area AA of the display panel DP may be visually observed through the transmission area TA.

The bezel area BZA may be an area with a lower light transmittance compared to a light transmittance of the transmission area TA. The bezel area BZA defines the shape of the transmission area TA. The bezel area BZA is adjacent to the transmission area TA and may at least partially surround the transmission area TA.

The bezel area BZA may have a predetermined color. When the window WP is provided as a glass and/or plastic substrate, the bezel area BZA may be a color layer printed on one side of the glass and/or plastic substrate, or the bezel area BZA may be a deposited color layer. Alternatively, the bezel area BZA may be formed by coloring the corresponding area of the glass and/or plastic substrate.

The bezel area BZA covers the non-active area NAA of the display panel DP so as to prevent the non-active area NAA from being observed from the outside. However, the window WP of the display device DD might not include the bezel area BZA, according to an exemplary embodiment of the present invention.

The display module DM may include a display panel DP, an input sensing sensor ISS, an antireflective layer POL, and an adhesive layer ADL. A predetermined hole HA may be defined in the display module DM. The hole HA may penetrate at least one of the display panel DP, the antireflective layer POL and the adhesive layer ADL.

The display panel DP may display the image IM and may detect the external input TC. The display panel DP includes a front face FS including an active area AA and a non-active area NAA. The active area AA may be an area activated according to an electrical signal.

In an exemplary embodiment of the present invention, the active area AA may be an area where the image IM is displayed. The transmission area TA at least partially overlaps the active area AA. For example, the transmission area TA overlaps the front surface or at least part of the active area AA. Accordingly, the user may view the image IM through the transmission area TA.

The non-active area NAA is the area at least partially covered by the bezel area BZA. The non-active area NAA is adjacent to the active area AA. The non-active area NAA surrounds at least a part of the active area AA. A driving circuit, a driving wiring, and the like for driving the active area AA may be disposed in the non-active area NAA.

In the non-active area NAA, various signal lines, pads PD, and/or electronic elements for providing an electrical signal to the active area AA may be disposed. The non-active area NAA may be covered by the bezel area BZA and thus may not be visible to the user from the outside.

In an exemplary embodiment of the present invention, the display panel DP is assembled in a flat state with the active area AA and the non-active area NAA facing the window WP. However, this is illustratively shown, and a part of the non-active area NAA of the display panel DP may be bent. A part of the non-active area NAA is directed to the rear surface of the display device DD, so that the bezel area BZA at the front surface of the display device DD may be reduced. Alternatively, the display panel DP may be assembled in a state where a part of the active area AA is also bent. Alternatively, the non-active area NAA may be omitted in the display panel DP according to an exemplary embodiment of the present invention.

The hole HA may have a relatively high transmittance compared with the active area AA. The hole HA is defined at a position overlapping with the electronic module EM. The electronic module EM is described later on herein. At least a portion of the hole HA may be surrounded by the active area AA. In the coupled state of the display device DD, according to an exemplary embodiment of the present invention, the hole HA may be disposed in the transmission area TA and may be defined at a position spaced apart from the bezel area BZA. For example, the hole HA may be disposed at an edge portion of the transmission area TA.

In an exemplary embodiment of the present invention, the hole HA is spaced apart from the non-active area NAA. It is shown that the hole HA is defined within the active area AA so that all edges are surrounded by the active area AA. For example, the hole HA may be located at the upper right of the display panel DP within the active area AA. However, the present invention is not limited thereto.

The input sensing sensor ISS may be disposed on the upper part of the display panel DP. The input sensing sensor ISS may be disposed on the display panel DP except for the area overlapping with the hole HA. For example, a hole corresponding to the hole HA may be disposed in the input sensing sensor ISS. The input sensing sensor ISS may include a plurality of sensors. The plurality of sensors may exhibit capacitance with each other. When the touch TC is applied, the capacitance between the plurality of sensors changes, and thus the display device DD may sense a correlative change in capacitance. The input sensing sensor ISS may sense the external input TC. For example, the input sensing sensor ISS may sense the external input TC provided to the window WP.

An antireflective layer POL may be placed between the window WP and the input sensing sensor ISS. The antireflective layer POL lowers the reflectance with respect to external light incident on the display panel DP from the outside of the window WP. In an exemplary embodiment of the present invention, the antireflective layer POL may include a polarizing layer.

The adhesive layer ADL is placed between the antireflective layer POL and the window WP. The adhesive layer ADL combines the antireflective layer POL and the window WP. When the antireflective layer POL according to the present invention is a color filter formed on the display panel DP, the adhesive layer ADL may substantially combine the display panel DP and the window WP. The adhesive layer ADL may include an optical clear adhesive, an optical clear resin, and/or a pressure sensitive adhesive, but is not limited to any particular embodiment as long as the material used is optically transparent.

The circuit board CB may be connected to the display panel DP. The circuit board CB may include a flexible board CF and a main board MB. The flexible board CF may include an insulating film and conductive wirings mounted on the insulating film. The conductive wirings are connected to the pads PD to electrically connect the circuit board CB and the display panel DP.

In an exemplary embodiment of the present invention, the flexible board CF may be assembled in a bent state. Thus, the main board MB is disposed on the rear surface of the display panel DP so that it may be stably received in the space provided by the housing HS. According to an exemplary embodiment of the present invention, the flexible board CF may be omitted, and the main board MB may be directly connected to the display panel DP.

The main board MB may include signal lines and electronic elements. The electronic elements may be connected to the signal lines and electrically connected to the display panel DP. The electronic elements generate various electrical signals, for example, a signal for generating the image IM or a signal for detecting an external input TC, or process detected signals. The main board MB may be provided in plurality corresponding to each electrical signal used for generation and processing, but the main circuit board MB is not limited to any particular embodiment.

The display device DD according to the exemplary embodiment of the present invention, the driving circuit for providing the electric signal to the active area AA may be directly mounted on the display panel DP. At this time, the driving circuit may be mounted in the form of a chip or may be formed together with the pixels PX. At this time, the area of the circuit board CB may be reduced or omitted. The display device DD according to an exemplary embodiment of the present invention may include various embodiments and is not limited to any particular embodiment.

The electronic module EM may be disposed at the lower part of the window WP. For example, the electronic module EM may be disposed on the rear surface of the display panel DP, or at least part of the electronic module EM may be disposed in the hole HA. According to the present invention, the electronic module EM may be surrounded by the active area AA. For example, an increase in the bezel area BZA may be prevented as compared with a case where the electronic module EM is disposed in the non-active area NAA.

In an exemplary embodiment of the present invention, the electronic module EM may include a camera module. The lens of the camera module may overlap the second hole HA2 (See FIG. 5D) in the third direction (e.g., the DR3 direction). The second hole HA2 may overlap the transmission area TA in the third direction (e.g., the DR3 direction). Accordingly, the lens of the camera module may detect an external image through the transmission area TA. The electronic module EM may thus easily recognize an external subject through the hole HA.

As shown in FIG. 3, the display panel DP includes a base substrate BS, a plurality of pixels PX, a plurality of signal lines GL, DL, and PL, a power supply pattern VDD, and a plurality of display pads DPD.

The active area AA and the non-active area NAA may be areas provided on a base substrate BS. The base substrate BS may include an insulating substrate. For example, the base substrate BS may be composed of a glass substrate, a plastic substrate, or a combination thereof.

The signal lines GL, DL and PL are connected to the pixels PX to transmit electrical signals to the pixels PX. A scan line GL, a data line DL, and a power supply line PL among the signal lines included in the display panel DP are illustratively shown. However, this is merely an example. The signal lines GL, DL, and PL may further include at least one of a power supply line, an initialization voltage line, and a light emission control line, but the signal lines are not limited to any particular embodiment.

The pixel PX may be disposed in the active area AA. In an exemplary embodiment of the present invention, a signal circuit diagram of one pixel PX among a plurality of pixels is enlarged and shown as an example. The pixel PX may include a first thin film transistor TR1, a capacitor CPP, a second thin film transistor TR2, and a light emitting element EE.

The first thin film transistor TR1 is connected to the scan line GL and the data line DL. The capacitor CPP is connected to the first thin film transistor TR1 and the power supply line PL. The second thin film transistor TR2 is connected to the first thin film transistor TR1, the capacitor CPP, and the light emitting element EE. The first thin film transistor TR1, the capacitor CPP and the second thin film transistor TR2 may control the operation of the light emitting element EE.

The light emitting element EE may emit light at a time and intensity corresponding to the data signal transmitted through the data line DL. For example, the light emitting element EE may include an organic light emitting element, a quantum dot light emitting element, an electrophoretic element, or an electrowetting element.

The light emitting device EE is connected to the power supply terminal VSS and is supplied with a power supply signal (hereinafter also referred to as a second power supply signal) different from a power supply signal (hereinafter also referred to as a first power supply signal) provided by the power supply line PL. The light emitting device EE may generate light corresponding to the difference between the electrical signal provided from the second thin film transistor TR2 and the second power source signal. However, this is illustrated by way of example, and each of the pixels PX may include electronic components having various configurations and arrangements, and the pixels PX are not limited to any particular embodiment.

The pixels PX are arranged around the hole HA. In an exemplary embodiment of the present invention, the boundary between the hole HA and the active area AA may have a closed curve shape. In the exemplary embodiment of the present invention according to FIG. 3, the boundary between the hole HA and the active area AA is illustratively shown as a circle. However, the present invention is not limited thereto. For example, the shape of the hole HA may be variously changed.

The power supply pattern VDD is disposed in a non-active area NAA. In an exemplary embodiment of the present invention, the power supply pattern VDD is connected to a plurality of power supply lines PL. Thus, the display panel DP includes the power supply pattern VDD, thereby providing the same first power supply signal for each of the pixels PX.

The display pads DPD may include a first pad P1 and a second pad P2. The plurality of first pads P1 may be connected to the data lines DL, respectively. The second pad P2 may be connected to the power supply pattern VDD and electrically connected to the power supply line PL. The display panel DP may provide electrical signals to the pixels PX that are externally provided through the display pads DPD. The display pads DPD may further include pads for receiving electrical signals other than the first pads P1 and the second pads P2, however, the display pads DPD are not limited to any particular embodiment.

Figure 4:
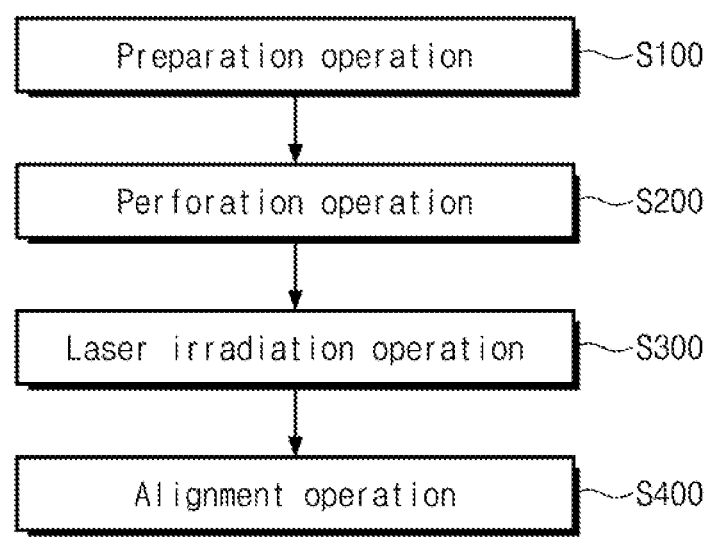
FIG. 4 is a flowchart illustrating a method of manufacturing a display device according to an exemplary embodiment of the present invention.
Figure 6:
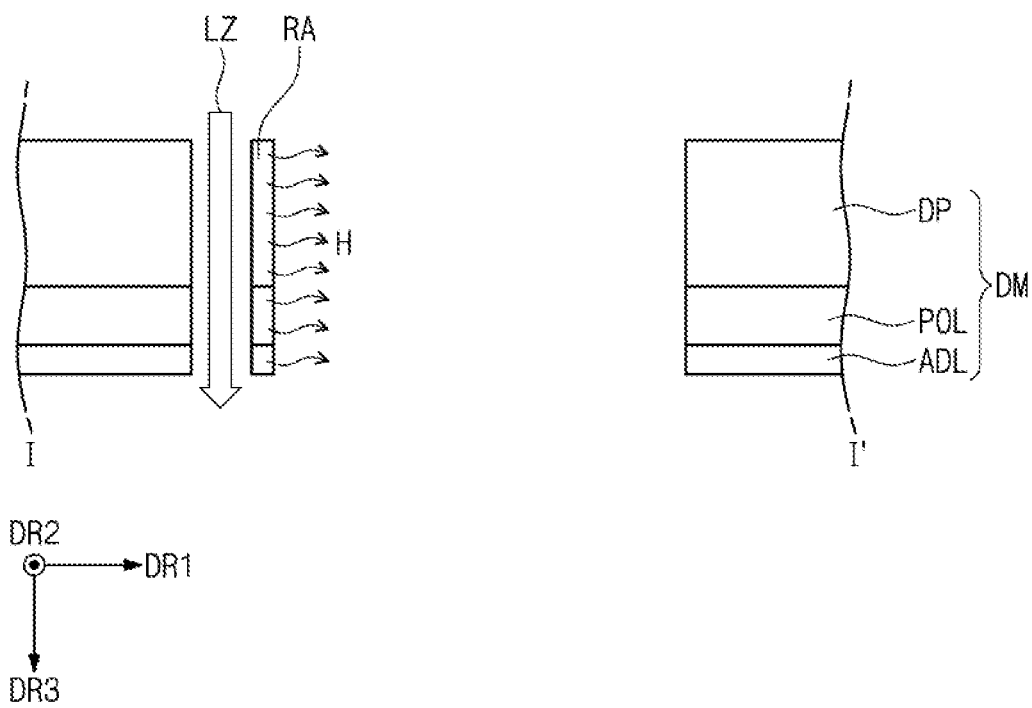
FIG. 6 is a cross-sectional view illustrating a cross-section taken along line I-I' of FIG. 5C according to an exemplary embodiment of the present invention.
Figure 7A:
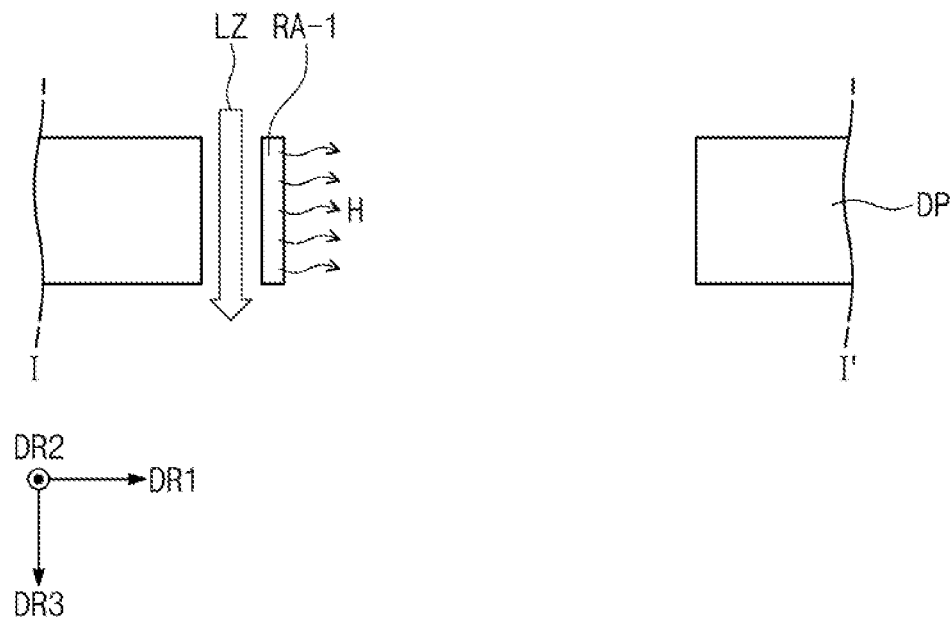
FIGS. 7A and 7B are cross sectional views illustrating a modified embodiment of FIG. 6 according to an exemplary embodiment of the present invention.
Figure 7B:
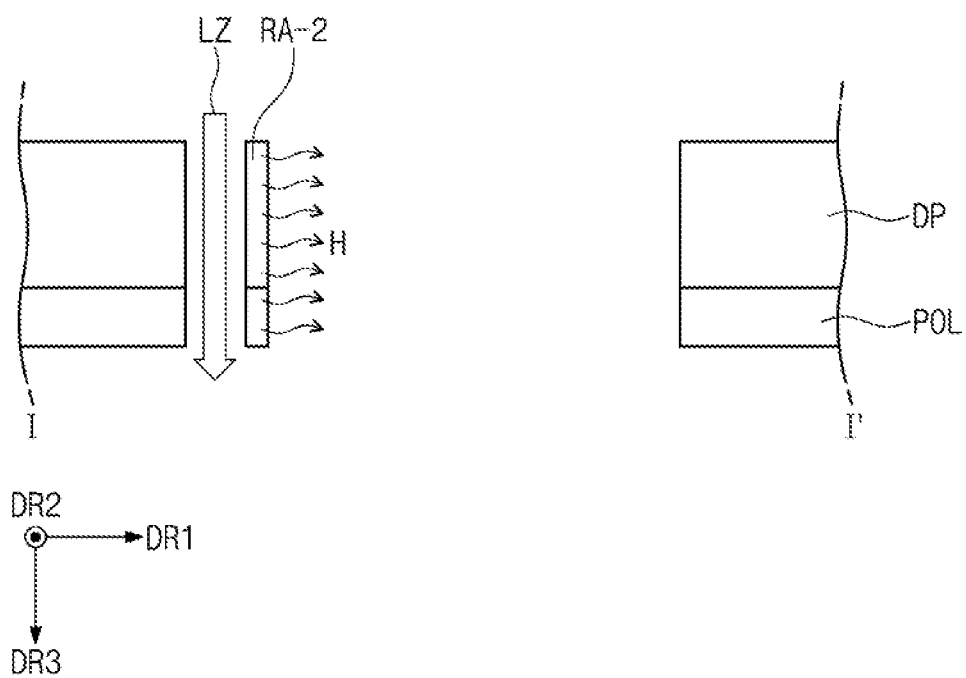

FIG. 4 illustrates a flowchart of a method of manufacturing a display device according to an exemplary embodiment of the present invention. FIGS. 5A, 5B, 5C and 5D illustrate a method of manufacturing a display device according to an exemplary embodiment of the present invention. FIG. 6 is a cross-sectional view illustrating a cross-section taken along line I-I' of FIG. 5C. FIGS. 7A and 7B show a modified embodiment of FIG. 6.

As shown in FIG. 4, a method of manufacturing a display device according to an exemplary embodiment of the present invention may include a preparation operation (S100), a perforation operation (S200), a laser irradiation operation (S300), and an alignment operation (S400).

Figure 5A:
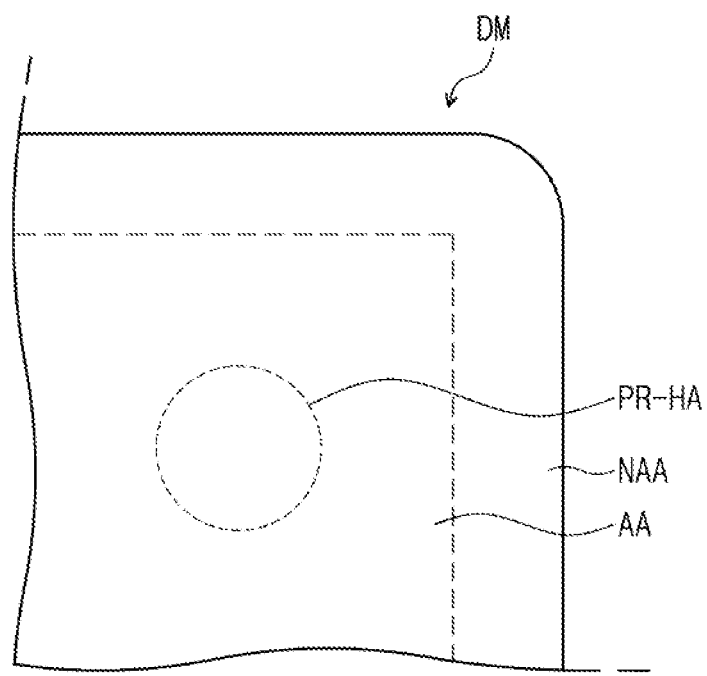
FIGS. 5A, 5B, 5C and 5D illustrate steps in a method of manufacturing a display device according to an exemplary embodiment of the present invention.
Figure 5A:
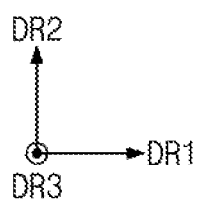

Referring to FIGS. 4 and 5A, the preparation operation (S100) according to an exemplary embodiment of the present invention may be an operation in which a display module DM is prepared. The display module DM may include an active area AA and a non-active area NAA of the display panel DP. The non-active area NAA may surround the active area AA. The perforating area PR-HA may overlap the active area AA. For example, the perforating area PR-HA may be disposed adjacent to the edge of the active area AA. The input sensing sensor ISS might not be disposed in the perforating area PR-HA.

Figure 5B:
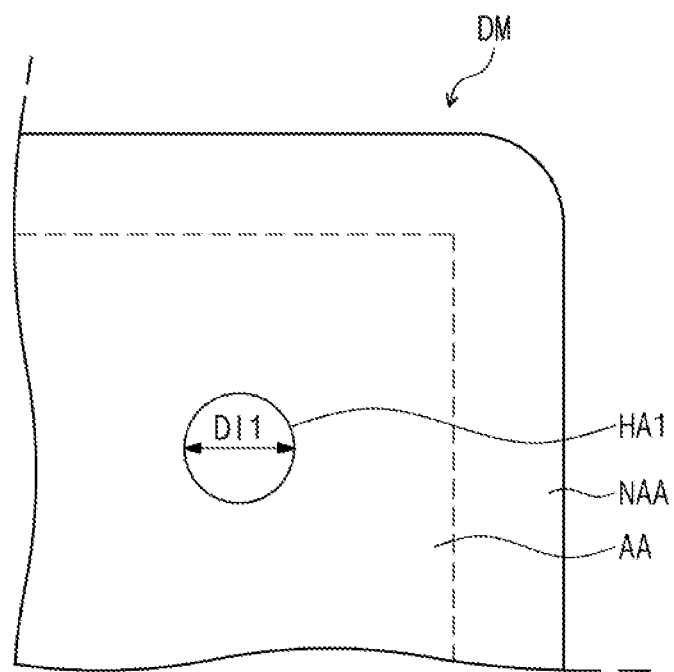
Figure 5B:
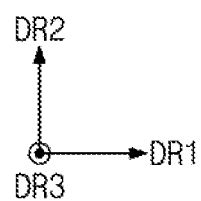

Referring to FIGS. 4 and 5B, the perforation operation (S200) may be an operation of perforating the perforating area PR-HA using, for example, a press. The perforation operation (S200) may be an operation of physically perforating the perforating area PR-HA. For example, the perforation operation 5200 may be an operation of forming a first hole HA1 in the display module DM. In the perforation operation (S200) according to an exemplary embodiment of the present invention, the perforation direction may be performed in the thickness direction of the display panel DP.

The perforation direction may be performed from the direction of the adhesive layer ADL in the display panel DP. For example, the perforation direction may bore through an upper surface of the display module DM (e.g., the adhesive layer ADL) in the thickness direction through a lower surface of the display module DM (e.g., the display panel DP) or vice versa. However, the present invention is not limited thereto.

In an exemplary embodiment of the present invention, the first hole HA1 may have a circular shape. However, the present invention is not limited thereto. The active area AA may surround the first hole HA1. The first hole HA1 may have a first diameter DI1.

Figure 5C:
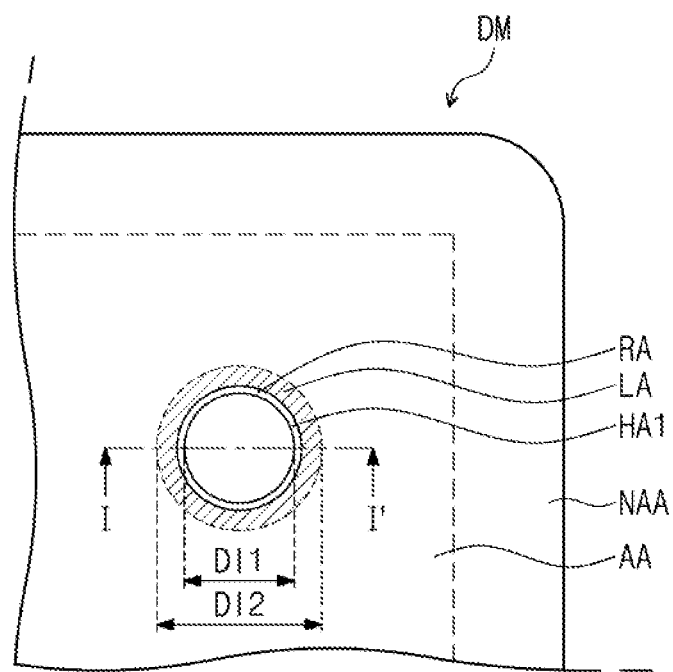

Referring to FIGS. 4 and 5C, the laser irradiation operation (S300) may be an operation of irradiating the laser area LA with a laser. The laser area LA may surround the first hole HA1. The laser area LA may have a circular shape. For example, the laser area LA may represent a concentric circle surrounding the first hole HA1 including a larger radius than the first hole HA1. However, the present invention is not limited thereto. For example, the inner edge of the laser area LA may be disposed apart from the outer edge of the first hole HA1 by a predetermined distance. An area between the laser area LA and the first hole HA1 may be defined as a residual area RA. For example, an intervening concentric circle comprised of the residual area RA may be disposed between the first hole HA1 and the laser area LA. In an exemplary embodiment of the present invention, the residual area RA may be omitted. The laser irradiation operation (S300) may irradiate the laser area LA with a laser. For example, the laser area LA may be removed in the laser irradiation operation (S300). The residual area RA may be removed together as the laser area LA is removed. Thus, the first hole HA1 may be processed into the second hole HA2. The second hole HA2 may have a second diameter DI2. The second diameter DI2 may be the diameter of the laser area LA. The second diameter DI2 may be greater than the first diameter DI1.

Referring to FIG. 6, in the laser irradiation operation (S300) of FIG. 5C, a heat H may be generated. For example, the heat H may be generated in the operation of irradiating the laser area LA with the laser LZ. The laser irradiation operation (S300) may be performed in the thickness direction from an outer surface of the display panel DP towards an outer surface of the adhesive layer ADL. The generated heat H may be emitted to the outside through the residual area RA. As the heat H is emitted to the outside, heat damage to the display module DM may be minimized.

According to an exemplary embodiment of the present invention, the antireflective layer POL and the adhesive layer ADL in the display module DM may be omitted, as shown in FIG. 7A. FIGS. 5A and 5B may be identically applied to the display panel DP. The heat H may be generated in the operation of irradiating the display panel DP with the laser LZ. The generated heat H may be emitted to the outside through the residual area RA-1. As a result, thermal damage to the display panel DP may be minimized.

According to an exemplary embodiment of the present invention, the adhesive layer ADL in the display module DM may be omitted, as shown in FIG. 7B. FIGS. 5A and 5B may be equally applied to the display panel DP and the antireflective layer POL. In the operation of irradiating the laser LZ to the display panel DP and the antireflective layer POL, heat H may be generated. The generated heat H may be emitted to the outside through the residual area RA-2. As a result, thermal damage to the display panel DP and antireflective layer POL may be minimized. According to an exemplary embodiment of the present invention, the display module DM may include an input sensing panel on the adhesive layer ADL instead of placing an input sensing sensor ISS between the display panel DP and the antireflective layer POL. The processes of FIGS. 5A to 5D may be identically applied to the input sensing panel so that the hole HA may be formed.

Figure 5D:
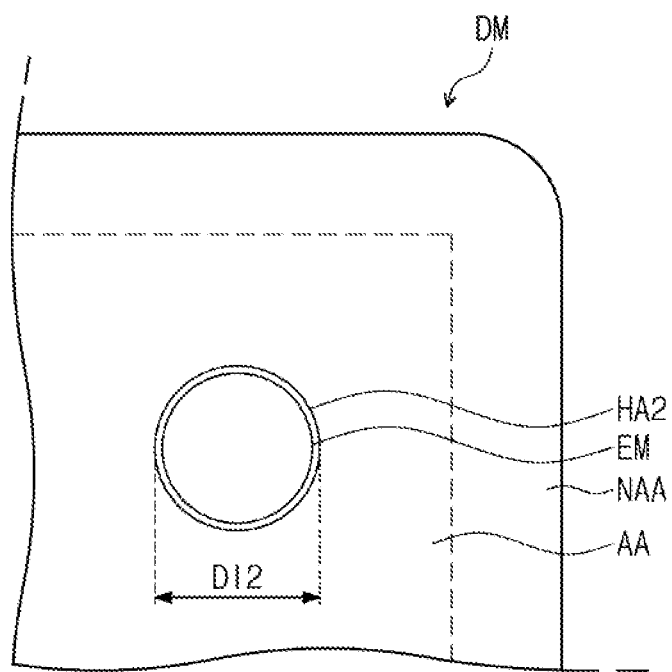

Referring to FIGS. 4 and 5D, the alignment operation (S400) may be an operation of disposing the electronic module EM in the second hole HA2. In an exemplary embodiment of the present invention, the electronic module EM may be, for example, a camera module. The lens of the camera module may overlap the second hole HA2 in the third direction (e.g., the DR3 direction). The second hole HA2 may overlap the transmission area TA in the third direction (e.g., the DR3 direction). Accordingly, the lens of the camera module may capture the image IM through the transmission area TA.

Figure 8A:
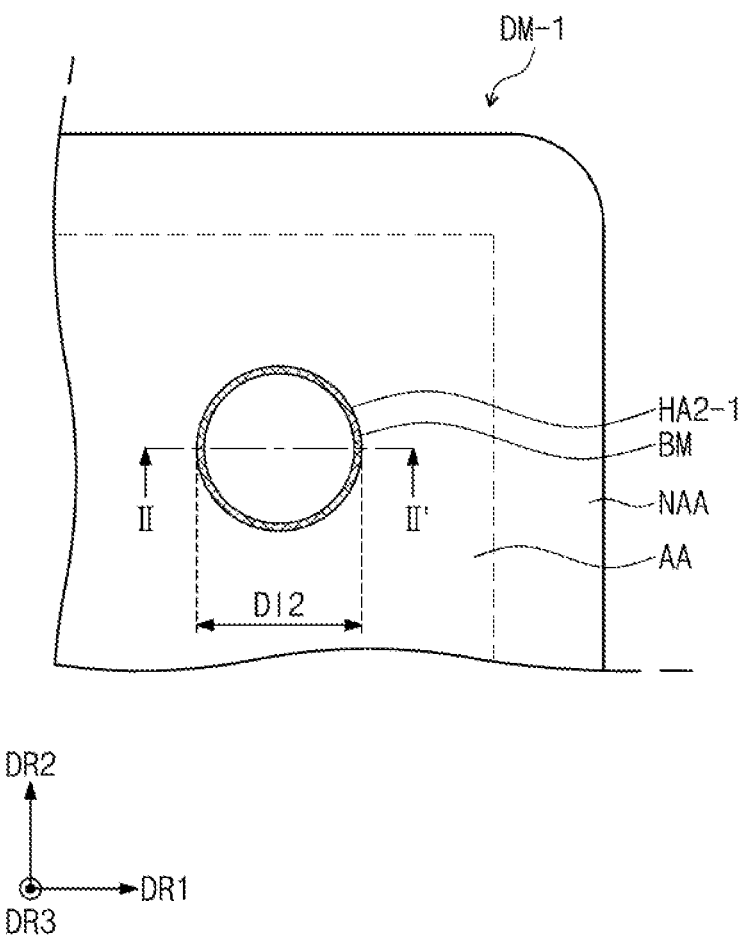
FIG. 8A is a plan view illustrating a display module according to an exemplary embodiment of the present invention.
Figure 8B:
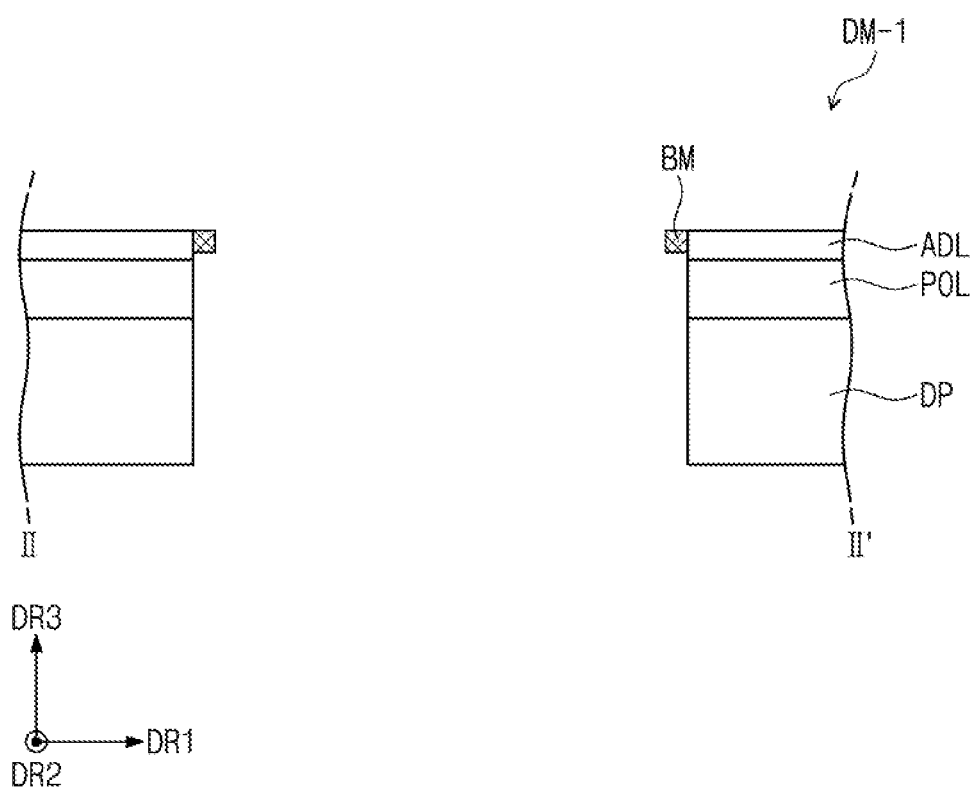
FIG. 8B is a cross-sectional view illustrating a cross-section taken along line II-II' of FIG. 8A.

FIG. 8A is a plan view of a display module according to an exemplary embodiment of the present invention. FIG. 8B is a cross-sectional view illustrating a cross-section taken along line II-II' of FIG. 8A.

The method of manufacturing the display module DM-1 according to an exemplary embodiment of the present invention may further include an operation of disposing a light shielding layer BM on at least a part of the inside of the second hole HA2-1.

For example, as shown in FIG. 8A, the light shielding layer BM may surround the inside of the second hole HA2-1. For example, as shown in FIG. 8B, the light shielding layer BM may surround only a part of the inside of the second hole HA2-1. For example, the light shielding layer BM may be disposed on an exposed side surface of the adhesive layer ADL. The light shielding layer BM may protrude into a portion of the interior of the second hole HA2-1. The light shielding layer BM may have a predetermined color. When the electronic module EM is disposed in the second hole HA2-1, the light shielding layer BM may cover the wirings of the electronic module EM to prevent the wirings from being visible from the outside. For example, the annular shaped light shielding layer BM may overlap the wirings of the electronic module EM in the third direction (e.g., the DR3 direction).

FIGS. 9A, 9B, 9C and 9D show a method of manufacturing a display device according to an exemplary embodiment of the present invention. FIG. 10 is a cross-sectional view illustrating a cross-section taken along line III-III' of FIG. 9B. Hereinafter, the display device manufacturing method flowchart of FIG. 4 will be described together with FIGS. 9 and 10.

Figure 9A:
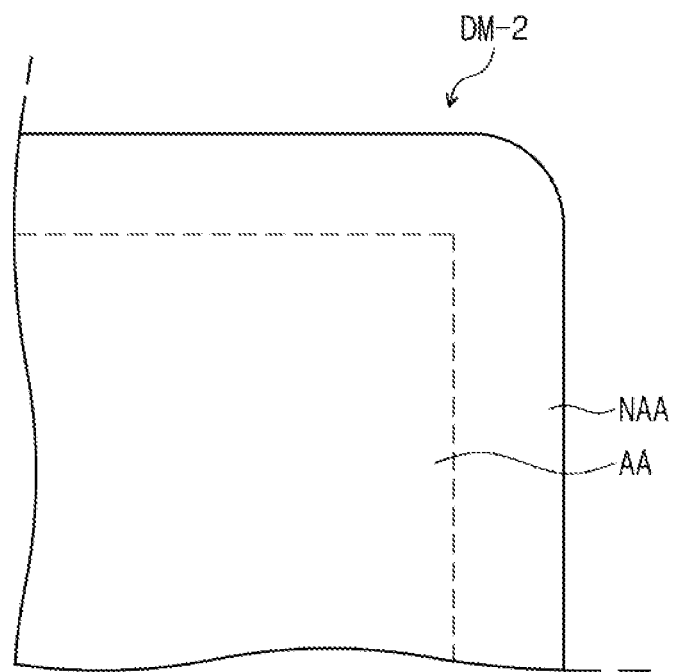
FIGS. 9A, 9B, 9C and 9D illustrate steps in a method of manufacturing a display device according to an exemplary embodiment of the present invention.
Figure 10:
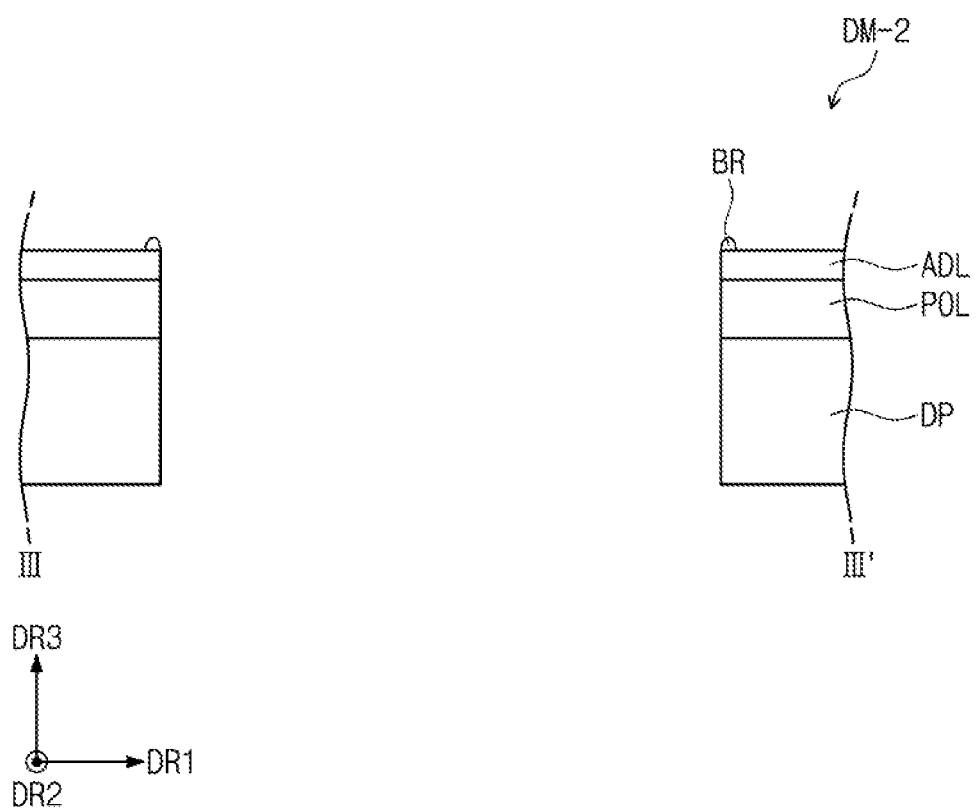
FIG. 10 is a cross-sectional view illustrating a cross-section taken along line III-III' of FIG. 9B.

Referring to FIGS. 4 and 9A, the preparation operation (S100) according to an exemplary embodiment of the present invention may be an operation of preparing a display module DM-2. The display module DM-2 may include an active area AA and a non-active area NAA of the display panel DP. The non-active area NAA may surround the active area AA. The description of FIG. 5A may be similarly applied to the other descriptions.

Figure 9B:
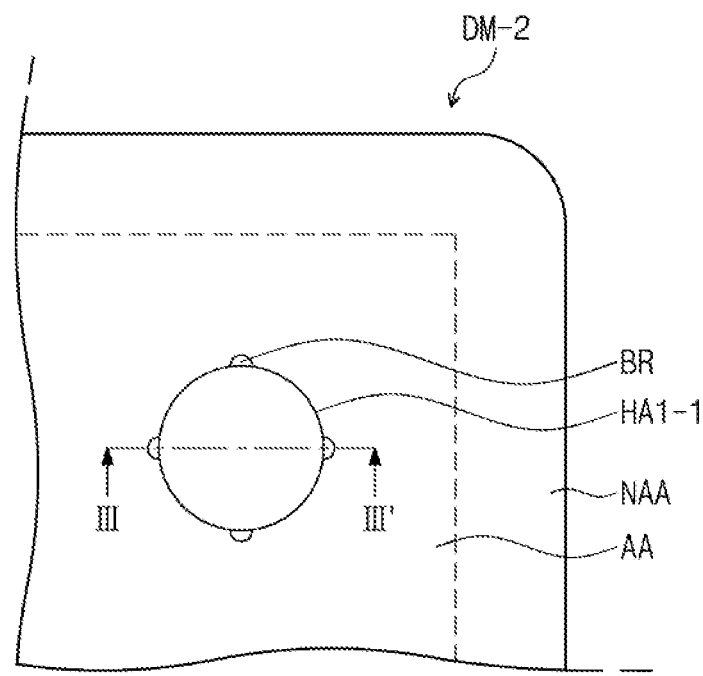

Referring to FIGS. 4 and 9B, the perforation operation (S200) may be an operation of perforating the display module DM-2. For example, it may be an operation of physically perforating the display module DM-2 using a press. The hole HA1-1 and the burr BR may be formed in the display module DM-2 in the perforation operation S200. The burr BR may be generated by a press perforation process.

In the perforation operation (S200) according to an exemplary embodiment of the present invention, the perforation direction may be performed in the thickness direction of the display panel DP. For example, the perforation direction may be performed in the direction of the adhesive layer ADL in the display panel DP. Depending on the perforation direction, the burr BR may be formed at various positions. For example, the burr BR may be formed on the adhesive layer ADL extending in the third direction (e.g., the DR3 direction). However, the perforation direction, the shape, and the formation position of the burr BR are not limited thereto.

The description of FIG. 5B may be similarly applied to the other descriptions.

Figure 9C:
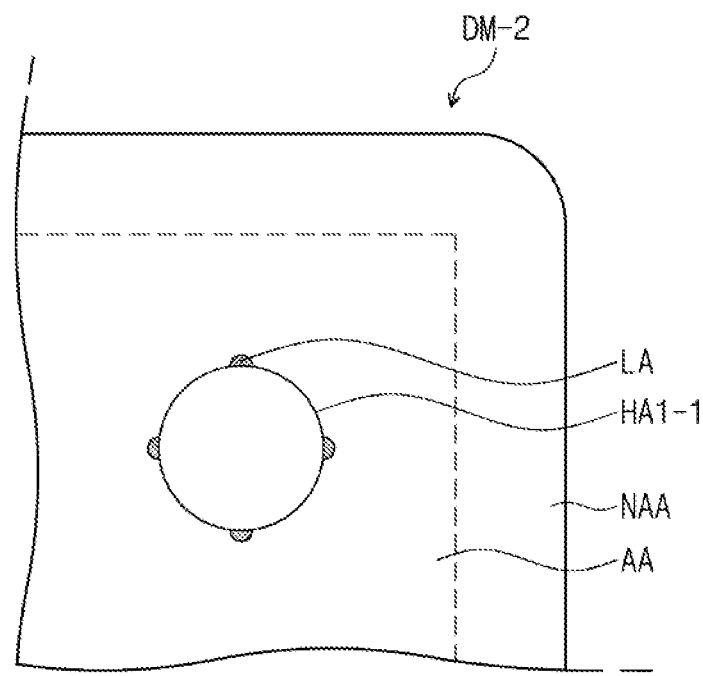

Referring to FIGS. 4, 9C and 10, the laser irradiation operation (S300) may be an operation of irradiating the burr BR with the laser LZ. For example, the laser irradiation operation (S300) may be an operation of removing the burr BR by irradiating the laser LZ. The laser LZ only removes the burr BR, and does not change the size of the holes HA1-1. For example, the method of manufacturing a display device according to an exemplary embodiment of the present invention may include forming the hole HA1-1 by first performing physical perforation. Thereafter, the hole HA1-1 may be finely processed by using the secondary laser LZ. For example, as shown in FIG. 10, the fine processing may be used to remove the burr BR with the laser LZ. However, the position of burr BR is illustratively shown, but is not limited thereto.

Since the laser LZ removes the burr BR, the intensity of the laser LZ may be weaker than the intensity of the laser irradiating the laser area LA of FIG. 5C. Thus, the degree to which the display module DM-2 is damaged by heat may be reduced.

Figure 9D:
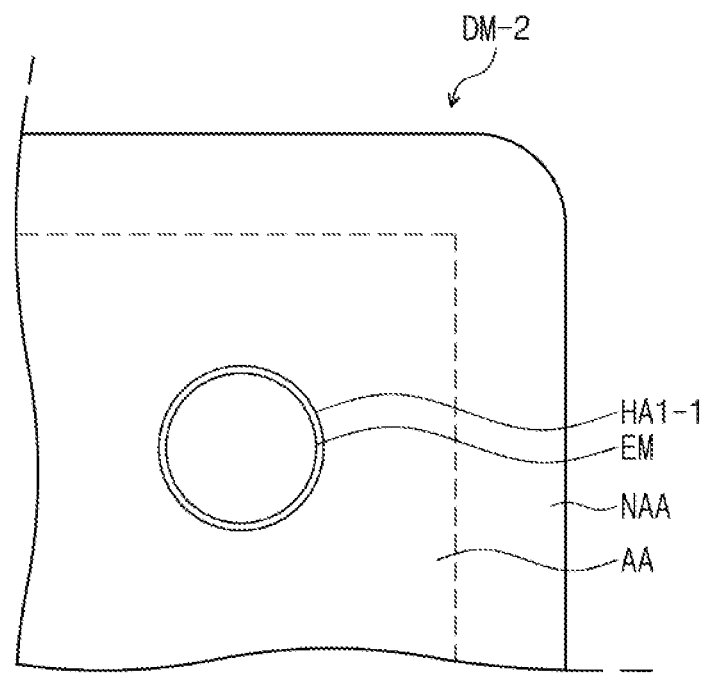
Figure 9D:
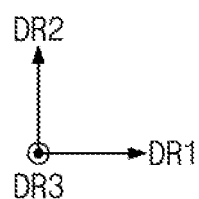

Referring to FIGS. 4 and 9D, the alignment operation (S400) may be an operation of disposing the electronic module EM in the hole HA1-1. The description of FIG. 5D may be similarly applied to the other descriptions.

A method of manufacturing a display device according to an exemplary embodiment of the present invention may minimize damage incurred by a display module due to heat associated with laser irradiation.

Although exemplary embodiments of the present invention have been described heretofore, it will be understood by those skilled in the art that various changes in form and details may be made therein without departing from the spirit and scope of the present invention as set forth in the following claims. present invention.

What is claimed is:

1. A display device manufacturing method, comprising:
providing a display module in which an active area and a non-active area surrounding the active area are defined;
perforating a first hole having a first diameter on the active area; and
forming a second hole having a second diameter by irradiating a laser area at least partially surrounding the first hole with a laser,
wherein the second diameter is larger than the first diameter, and
wherein the first hole and the second hole are formed in the same layers.

2. The method of claim 1, wherein the second hole is formed adjacent to an edge of the active area.

3. The method of claim 1, wherein the laser area is spaced apart from the first hole by an intervening residual area.

4. The method of claim 1, wherein a diameter of the laser area is equal to t second diameter.

5. The method of claim 1, further comprising aligning an electronic module to correspond to the second hole.

6. The method of claim 5, wherein the electronic module comprises a camera module,
wherein the second hole overlaps a lens of the camera module.

7. The method of claim 1, wherein the second hole has a circular shape.

8. The method of claim 1, further comprising disposing a window on the display module.

9. The method of claim 1, wherein the display module comprises a display panel, an antireflective layer, and an adhesive layer.

10. The method of claim 9, wherein the antireflective layer comprises a polarizing layer.

11. The method of claim 1, further comprising disposing a light shielding layer on at least a portion of the inside of the second hole.

12. The method of claim 1, wherein the display module further comprises an input sensing sensor.

13. A display device manufacturing method, comprising:
preparing a display module in which an active area for displaying an image and a non-active area surrounding the active area are defined;
performing press-perforation on the active area to form a hole and a burr directly adjacent to the hole;
irradiating the burr with a laser; and
aligning an electronic module corresponding to the hole, wherein the electronic module comprises a camera module and the hole overlaps a lens of the camera module.

14. The method of claim 13, wherein the hole is formed adjacent to an edge of the active area.

15. The method of claim 13, wherein the hole has a circular shape.

16. The method of claim 13, further comprising disposing a window on the display module.

17. The method of claim 13, wherein the display module comprises a display panel, an antireflective layer, and an adhesive layer.

18. The method of claim 17, wherein the antireflective layer comprises a polarizing layer.

19. The method of claim 13, further comprising disposing a light shielding layer on at least a portion of the inside of the hole.

* * * * *